(12) United States Patent
Luan

(10) Patent No.: US 12,176,209 B2
(45) Date of Patent: Dec. 24, 2024

(54) FORMATION OF STACKED LATERAL SEMICONDUCTOR DEVICES AND THE RESULTING STRUCTURES

(71) Applicant: TC Lab, Inc., Gilroy, CA (US)

(72) Inventor: Harry Luan, Saratoga, CA (US)

(73) Assignee: TC Lab, Inc., Gilroy, CA (US)

( * ) Notice: Subject to any disclaimer, the term of this patent is extended or adjusted under 35 U.S.C. 154(b) by 146 days.

(21) Appl. No.: 17/229,655

(22) Filed: Apr. 13, 2021

(65) Prior Publication Data

US 2021/0233767 A1 Jul. 29, 2021

Related U.S. Application Data

(60) Division of application No. 15/989,097, filed on May 24, 2018, now Pat. No. 10,978,297, which is a continuation-in-part of application No. 15/957,865, filed on Apr. 19, 2018, now Pat. No. 10,748,903.

(51) Int. Cl.
| | |
|---|---|
| *H01L 29/74* | (2006.01) |
| *G11C 11/39* | (2006.01) |
| *H01L 21/02* | (2006.01) |
| *G11C 17/06* | (2006.01) |

(52) U.S. Cl.
CPC ...... *H01L 21/0259* (2013.01); *H01L 21/0257* (2013.01); *H01L 29/7436* (2013.01); *G11C 11/39* (2013.01); *G11C 17/06* (2013.01)

(58) Field of Classification Search
CPC ............... H01L 27/101; H01L 27/1021; H01L 27/2409; H01L 27/249; H01L 21/0257; H01L 21/0259; H01L 27/1027; H01L 29/74; H01L 29/7436; G11C 11/39; G11C 17/06

See application file for complete search history.

(56) References Cited

U.S. PATENT DOCUMENTS

| | | | |
|---|---|---|---|
| 6,462,359 B1 | 10/2002 | Nemati et al. | |
| 9,013,918 B2 | 4/2015 | Liang et al. | |
| 9,779,948 B1 | 10/2017 | Baraskar et al. | |
| 2012/0091413 A1* | 4/2012 | Nguyen | H01L 27/249 |
| | | | 257/E45.001 |

(Continued)

FOREIGN PATENT DOCUMENTS

| | | |
|---|---|---|
| CN | 104269404 | 1/2015 |
| CN | 107731823 | 2/2018 |

OTHER PUBLICATIONS

Kim Y. et al., Design and Electrical Characterization of 2-T Thyristor RAM With Low Power Consumption. IEEE Electron Device Letters, vol. 39, No. 3, Mar. 2018, pp. 355-358, <DOI: 10.1109/LED.2018.2796139>.

(Continued)

*Primary Examiner* — Meiya Li
(74) *Attorney, Agent, or Firm* — Aka Chan LLP

(57) ABSTRACT

A method of making stacked lateral semiconductor devices is disclosed. The method includes depositing a stack of alternating layers of different materials. Slots or holes are cut through the layers for subsequent formation of single crystal semiconductor fences or pillars. When each of the alternating layers of one material are removed space is provided for formation of single crystal semiconductor devices between the remaining layers. The devices are doped as the single crystal silicon is formed.

6 Claims, 16 Drawing Sheets

(56) References Cited

U.S. PATENT DOCUMENTS

2013/0083589 A1   4/2013   Or-Bach et al.
2015/0132906 A1   5/2015   Chang et al.
2017/0025421 A1   1/2017   Sakakibara et al.

OTHER PUBLICATIONS

International Search Report, PCT Application PCT/US2019/028414, Aug. 27, 2019, 4 pages.

* cited by examiner

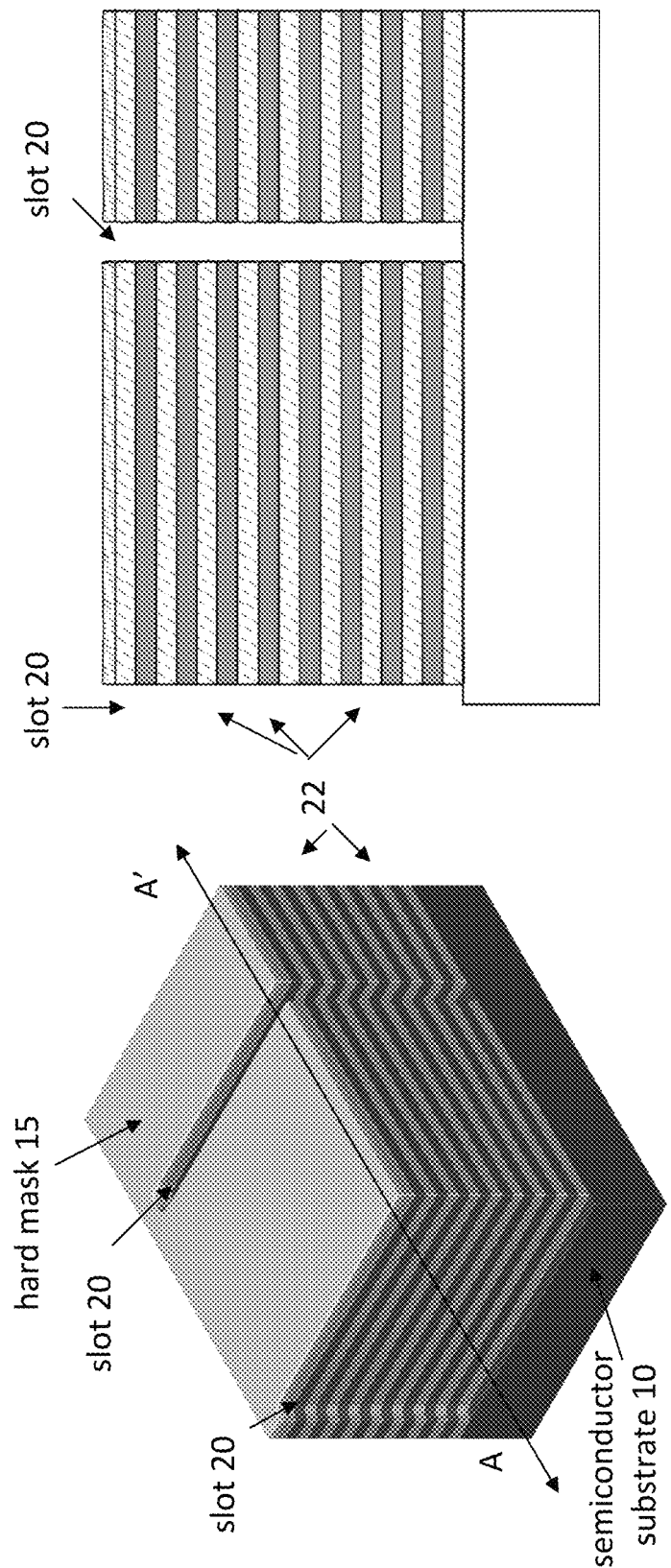

FORMATION OF STACKED LATERAL SEMICONDUCTOR DEVICES AND THE RESULTING STRUCTURES

CROSS-REFERENCE TO RELATED APPLICATIONS

This application is a divisional of U.S. patent application Ser. No. 15/989,097, filed May 24, 2018, entitled "Formation of Stacked Lateral Semiconductor Devices and the Resulting Structures," issued as U.S. Pat. No. 10,978,297 on Apr. 13, 2021, which is a continuation-in-part from U.S. patent application Ser. No. 15/957,865, filed Apr. 19, 2018, entitled "Multi-Layer Random Access Memory and Methods of Manufacture," issued as U.S. Pat. No. 10,748,903 on Aug. 18, 2020. These applications are incorporated by reference along with all other references cited in this application.

BACKGROUND OF THE INVENTION

This invention relates to processes for forming stacked arrays of lateral semiconductor devices. In particular, methods are described for forming three-dimensional arrays of semiconductor devices and the structures from such processes.

As geometrical scaling of semiconductor devices encounters ever increasing process variability and wafer cost, both memory and logic devices benefit by going from mere two-dimensional arrays to three dimensional arrays. Because of high carrier mobility, high performance, and low junction leakage, single crystal device materials are preferred. Conventionally, layered single crystal semiconductor devices have been fabricated in three ways: (a) wafer thinning and bonding; (b) interconnections using through silicon vias; and (c) polysilicon deposition with laser annealing. These processes are either wafer-scale integration or require repeated expensive lithography and annealing steps, thus manufacturing cost scales linearly with the number of layers stacked.

Various dynamic random access memory (DRAM) semiconductor cell structures have been proposed using thyristors. The assignee herein describes several thyristor semiconductor structures for DRAMs, and the processes for manufacturing them in two, as well as three-dimension arrays, in various commonly assigned co-pending patent applications.

The 1-transistor 1-capacitor memory cell has been by far the predominant memory cell used in DRAM devices for the last 30 years. Bit density has quadrupled approximately every 3 years by lithographical scaling and ever increasing process complexity. Maintaining the capacitance value and low transistor leakage, however, are significant issues for further reductions in cell area.

Recently alternative DRAM cells have been proposed to overcome the scaling challenges of conventional DRAM technology. These include floating body DRAM (FBDRAM), a single metal-oxide-semiconductor field-effect transistor (MOSFET) built on either a silicon-on-insulator (Okhonin, Int. SOI Conf, 2001) or in triple-well with a buried n-implant (Ranica, VLSI Technology, 2004). These technologies have yet to solve data retention issues, particularly in small geometry cells.

Various cell designs have been proposed based on the negative differential resistance behavior of a thyristor. An active or passive gate is often used in these designs to optimize trade-offs among switching speed, retention leakage, and operation voltage. The thin capacitively coupled thyristor disclosed in U.S. Pat. No. 6,462,359 is a lateral pnpn thyristor constructed on a silicon-on-insulator substrate with a coupling gate.

Liang in U.S. Pat. No. 9,013,918 discloses a pnpn thyristor cell on a silicon substrate which operates in forward and reverse breakdown region for writing data into a memory cell. The use of epitaxial or chemical vapor deposition (CVD) semiconductor layers at the backend of the standard CMOS (Complementary Metal-Oxide-Semiconductor) process, add-on thermal cycles and etch steps, however, degrade performance and yield of devices previously formed on the substrate. In addition, pnpn devices operated in the breakdown regime pose challenges in process control and power consumption.

Recently, Kim et al. reported electrical characteristics for a thyristor based memory in "Design and Electrical Characterization of 2-T Thyristor RAM (random access memory) with Low Power Consumption," IEEE Electron Device Letters, volume 39, issue 3, Jan. 23, 2018.

BRIEF SUMMARY OF THE INVENTION

A method of making stacked lateral semiconductor devices includes steps of depositing alternating layers of first and second material on a semiconductor substrate. Next a first region of each of the layers down to the substrate is removed and single crystal semiconductor is formed in the first region. Then each of the layers of second material is removed and single crystal semiconductor material is formed in the spaces between the first layers.

During the step of forming single crystal semiconductor, dopants are introduced to dope the single crystal semiconductor material to have desired conductivity type. Preferably this in-situ doping operation uses both p-conductivity type and n-conductivity type of doping species to form at least one pn junction. In one implementation the dopants are used to form thyristors with three pn junctions.

In another implementation a method of making stacked lateral semiconductor devices includes steps of depositing alternating layers of silicon dioxide and silicon nitride on a semiconductor substrate. A slot is then etched through all of the layers down to the substrate, and using the substrate as a seed, single crystal semiconductor material is formed in the slot. Next another slot, referred to herein as a support slot, is etched through all of the layers and filled with dielectric material.

Then a stack cut parallel to, and spaced apart from, the first slot is etched through the layers. The stack cut exposes the silicon nitride layers from the edge and enables an isotropic etch to remove all of the silicon nitride from between the layers of silicon dioxide. Single crystal semiconductor material is then formed in the spaces using a confined epitaxial overgrowth (CEO) process. During this process dopants are introduced to form desired semiconductor devices, e.g. diodes, thyristors, etc. These stacked sheet diodes or thyristors are later separated by isolation cuts.

In yet another implementation a method of making stacked lateral semiconductor devices includes steps of depositing alternating layers of silicon dioxide and silicon nitride on a semiconductor substrate. A series of spaced apart holes are then etched through all of the layers. Then using the substrate as a seed, single crystal semiconductor material is formed to fill the holes.

Next isolation slots between adjacent hole regions are etched through all the layers and filled with dielectric material. Then stack cuts are made though each of the layers down to the substrate. The stack cuts are orthogonal to and spaced apart from ends of the isolation slots. The layers of silicon nitride are then isotropically etched away and single crystal semiconductor formed in the resulting openings. As the single crystal semiconductor is formed, it is doped with desired n-conductivity and p-conductivity type impurity to form desired semiconductor devices. Electrical contacts are then formed to the semiconductor devices.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIGS. 2A and 2B are a perspective and cross-sectional views after etching first slots through a layered insulator stack.

DETAILED DESCRIPTION OF THE INVENTION

The assignee of this application has previously disclosed memory devices suitable for a variety of applications. It is advantageous, however, to be able to stack the memory cells to provide multiple layers of memory cells in a memory array. This increases bit density per unit area and further reduces patterning cost. This application discloses designs and methods of manufacturing a multiple layer single crystal semiconductor structure.

Features of the invention include: an exemplary stacked memory array with memory cells selectively formed using confined epitaxial lateral overgrowth (ELO) of single crystalline silicon, or other semiconductor materials. If the devices are thyristor memory cells, each thyristor consists of pnpn or npnp thyristor in-situ doped during epitaxial growth.

Figure 1:
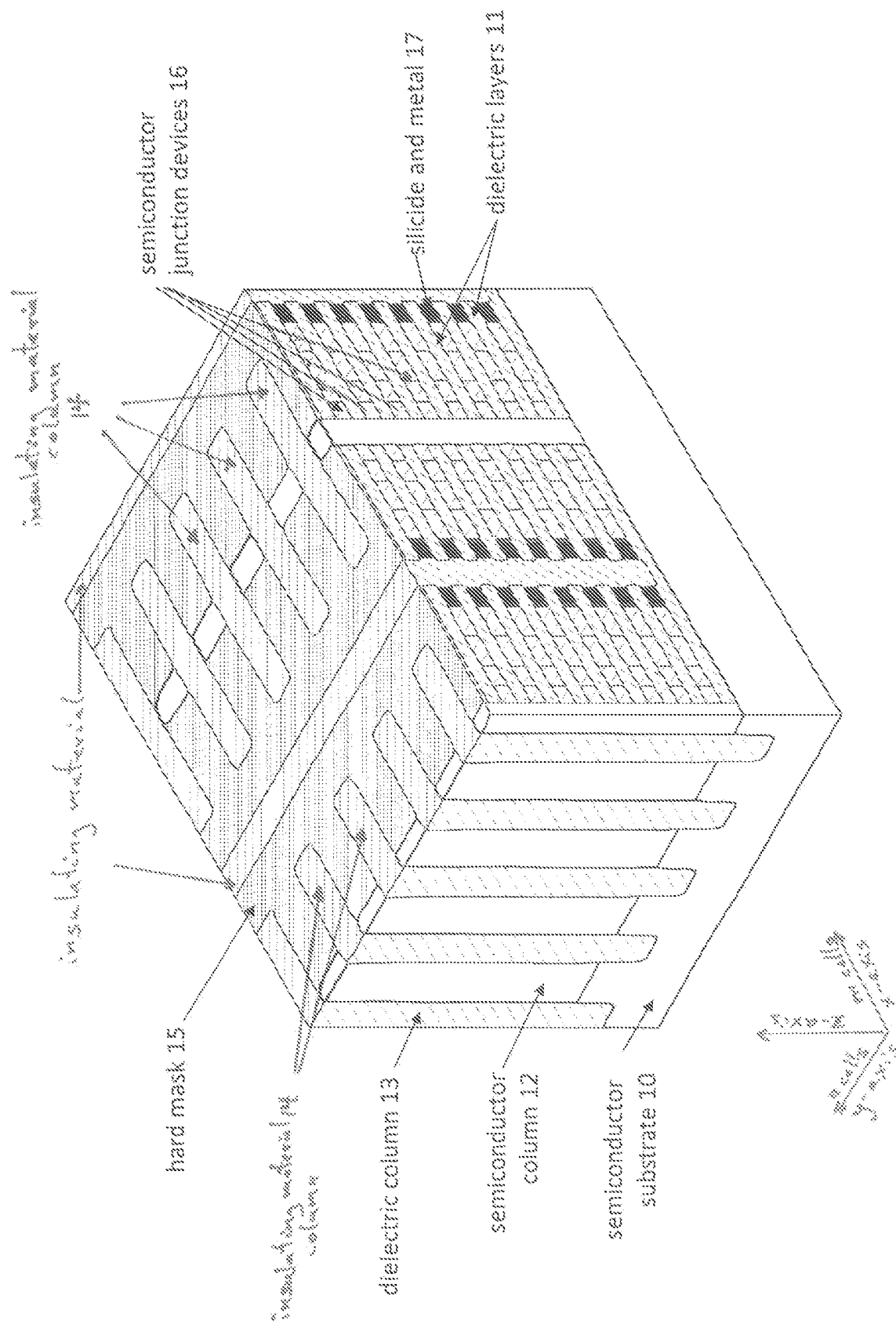
FIG. 1 is a perspective view of an 8-layer stacked memory array with semiconductor junction device memory cells.

FIG. 1 illustrates a small portion of a semiconductor memory array structure where junction devices 16 are repeated in 3-dimensions. FIGS. 2-9 illustrate a preferred process for fabricating the array. In FIG. 1, the three-dimensional array of junction devices in single crystal semiconductor using ELO seeded from vertical selective epitaxial growth (SEG) single crystal semiconductor walls. Junction devices are isolated after ELO growth by vertical cut and dielectric material fill.

In a typical implementation, the structure shown in FIG. 1 is only a small portion of the memory array. In FIG. 1 the memory cells are preferably thyristors, however, those of skill in the art will appreciate other types of memory devices may also be employed. For example, in other embodiments, phase change memory cells, fuses, anti-fuses, resistive elements or other memory cell types can be employed from the teaching of this invention.

As shown in FIG. 1, on a semiconductor substrate 10, SEG semiconductor columns 12 are electrically isolated from other columns by intervening dielectric columns 13. Each layer of junction devices 16 is isolated from layers above and below it by an intervening layer of dielectric 11.

FIG. 2A is a perspective view, and FIG. 2B is a cross-sectional view along line A-A', after forming a stack of alternating layers 22 of two materials having different etching characteristics, e.g., silicon dioxide and silicon nitride. The number of layers deposited determines the number of layers of memory devices to be formed, with one layer of, e.g., silicon nitride deposited for each layer of memory cells. On the top of the structure, a hard mask 15, typically a metal oxide such as aluminum oxide ($Al_2O_3$), is formed. After patterning the mask, appropriate etchants are used to cut slots 20 through all layers for formation of single crystal silicon. The slots 20 extend through the layers, stopping at the single crystal semiconductor substrate 10.

Figure 3B:
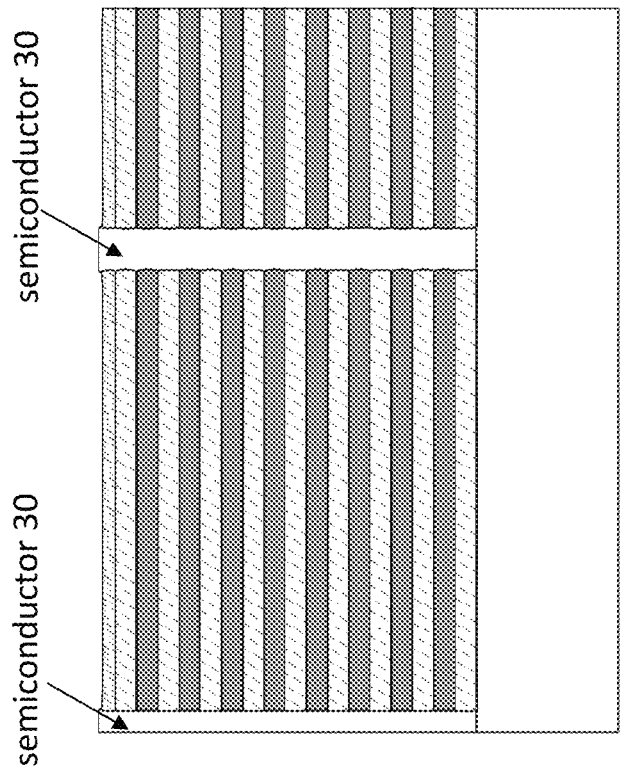
FIGS. 3A and 3B are a perspective and cross-sectional views after forming single crystal semiconductor fences in the structure of the preceding figure.
Figure 3A:
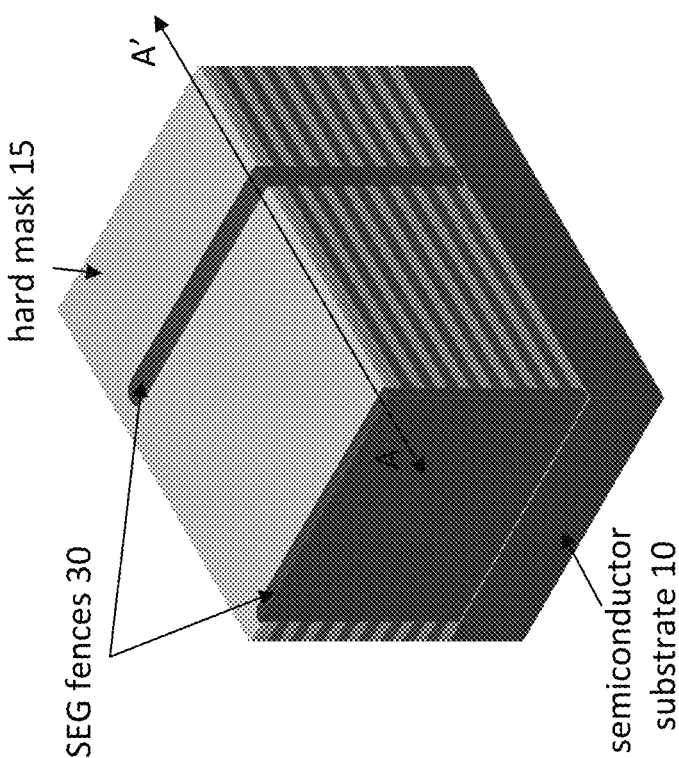

As next shown by FIGS. 3A and 3B, after a well-known post-etch cleaning, single crystal semiconductor fences or walls are grown inside the slots using selective epitaxial growth (SEG). The SEG process "grows" single-crystal silicon only from the bottom of the slots where the single crystal semiconductor substrate 10 is exposed.

Figure 5:
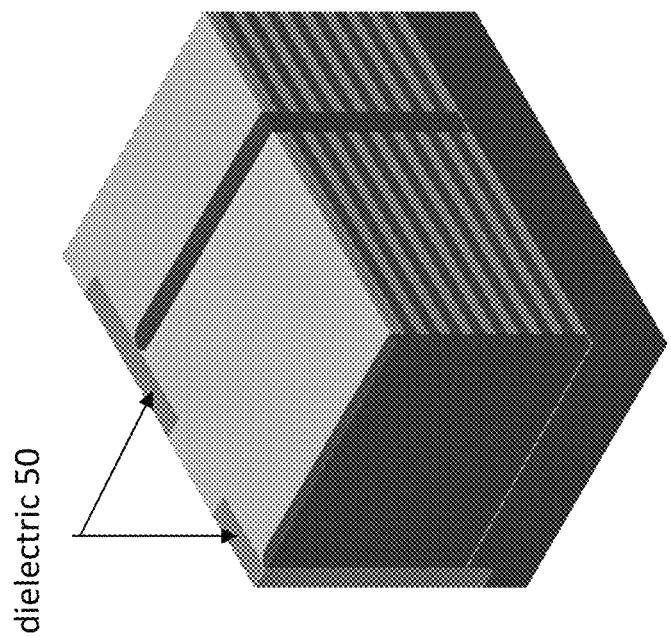
FIG. 5 is a perspective view after filling the support slots with dielectric material.
Figure 4:
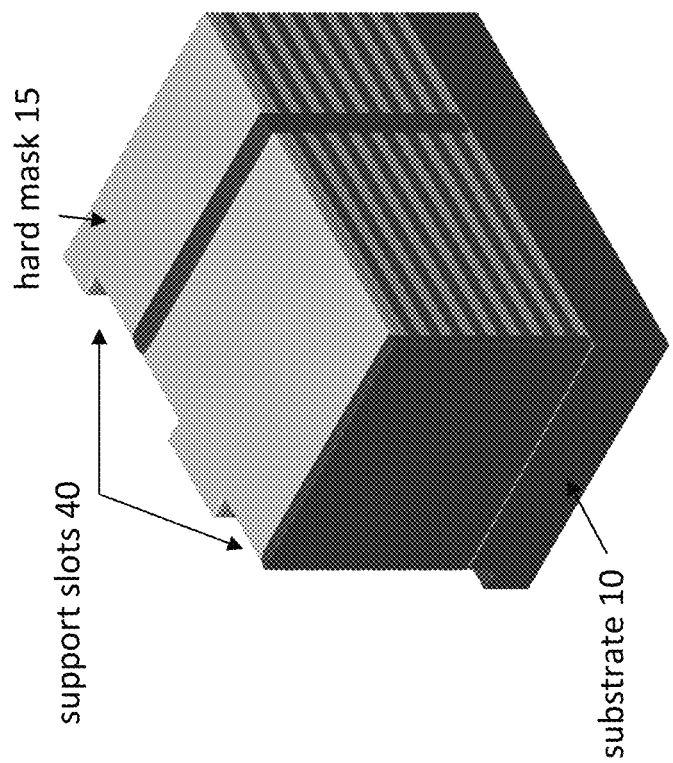
FIG. 4 is a perspective view after etching support slots in the structure of the preceding figure.

The next steps in the process are illustrated by FIGS. 4 and 5. Using lithography masking and well-known dry etching technology, support slots 40 are etched through all of the layers down to and optionally into the substrate 10. Then, as shown in FIG. 5, the slots are filled with dielectric material 50 to provide dielectric support pillars. The structure is then planarized, preferably using a chemical mechanical polishing process (CMP). The dielectric support pillars are repeated for specified distances ranging from 1 μm to 100 μm depending on the number of layers. The purpose of the pillars is to support mechanically the number of first dielectric layers after the second dielectric layers are etched away, as described below in FIG. 7.

Figure 6B:
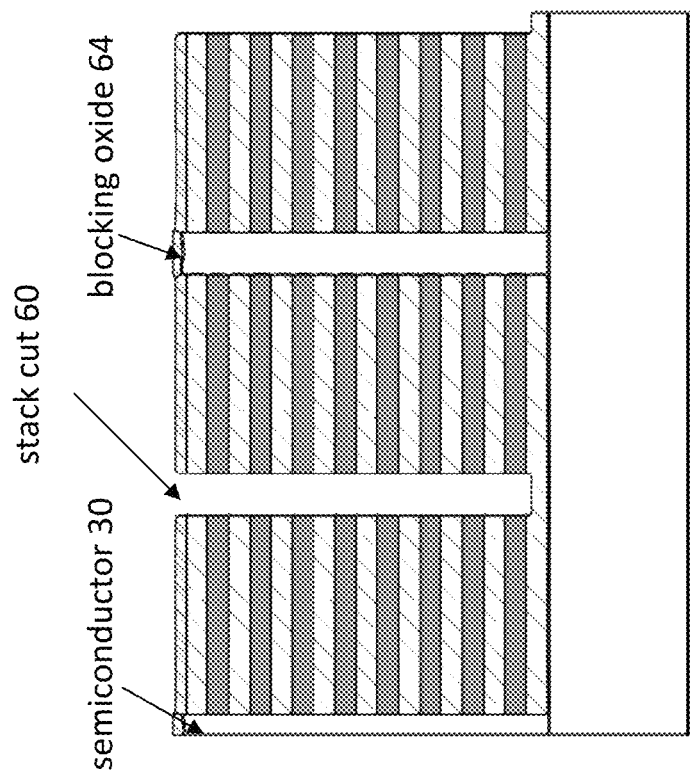
FIGS. 6A and 6B are a perspective and cross-sectional views after stack cuts are made in the structure.
Figure 6A:
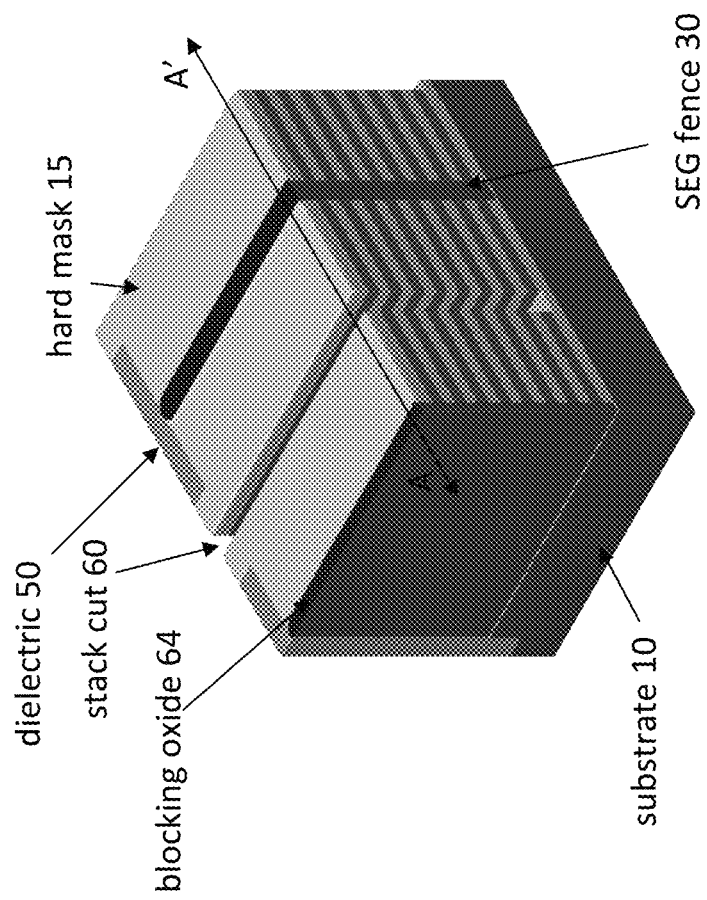

The next step in the process is etching stack cuts 60 through all of the layers down to the bottom dielectric layer, usually silicon dioxide. The stack cuts are shown in FIG. 6A. The cuts 60 divide the structure into parallel stacks of layers in which electrically separate semiconductor devices will be formed, as described below. The stack cuts 60 are made in the areas between the support slot cuts and their dielectric 50. The cuts are shown in cross-section in FIG. 6B. After making the cuts 60, the exposed semiconductor surfaces are oxidized to prevent further epitaxial silicon growth in those regions, labeled blocking oxide 64 in FIGS. 6A and 6B.

Figures 7A, 7B:
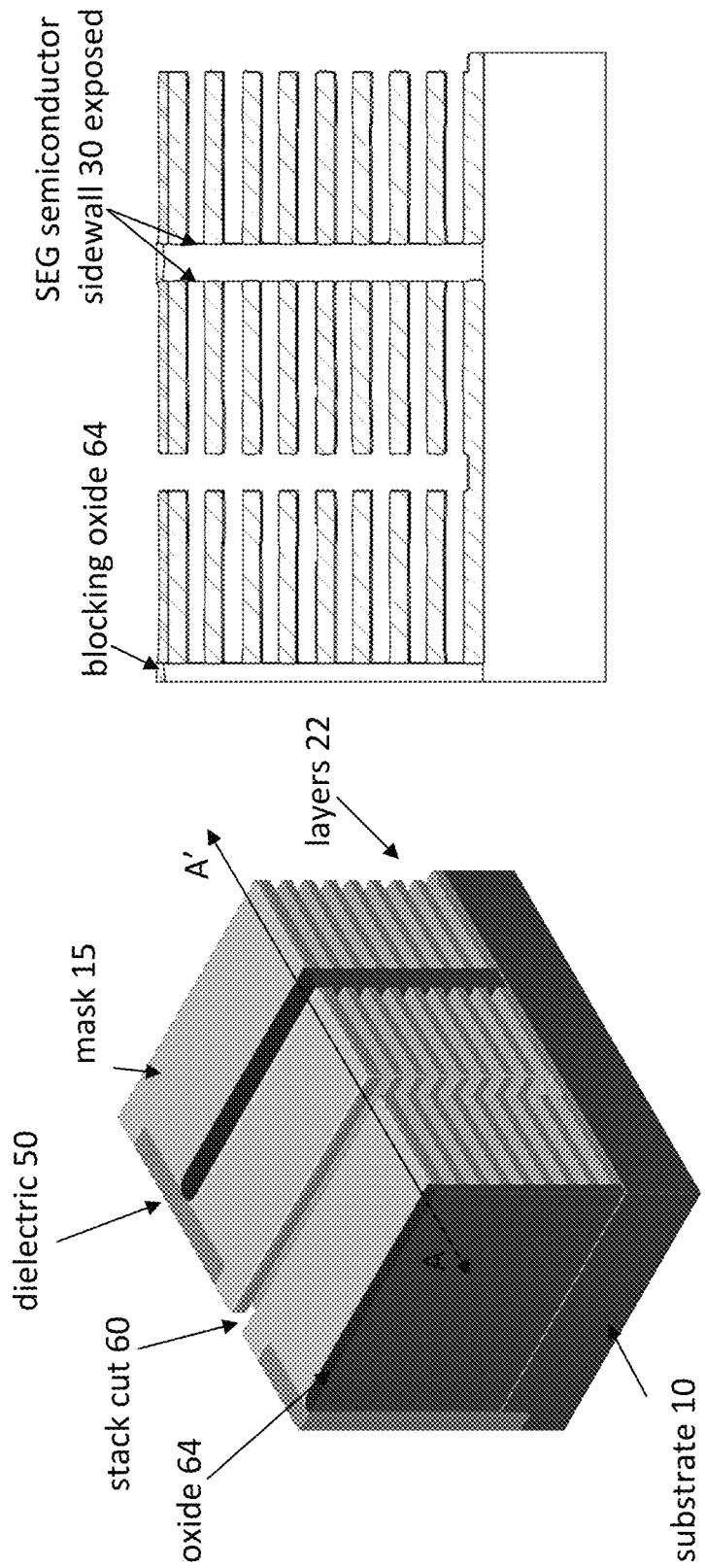
FIGS. 7A and 7B are a perspective and cross-sectional views after an etching step.

Using an appropriate isotropic etchant the structure is next selectively etched to remove the alternating layers of the stacks where exposed by the stack cuts. The resulting structure is shown in FIG. 7A and in cross-section in FIG. 7B. In the preferred embodiment the silicon nitride layers are removed, leaving only the silicon dioxide layers. The silicon dioxide layers 22 are supported by the dielectric 50 and the SEG 30 fences.

Figure 8B:
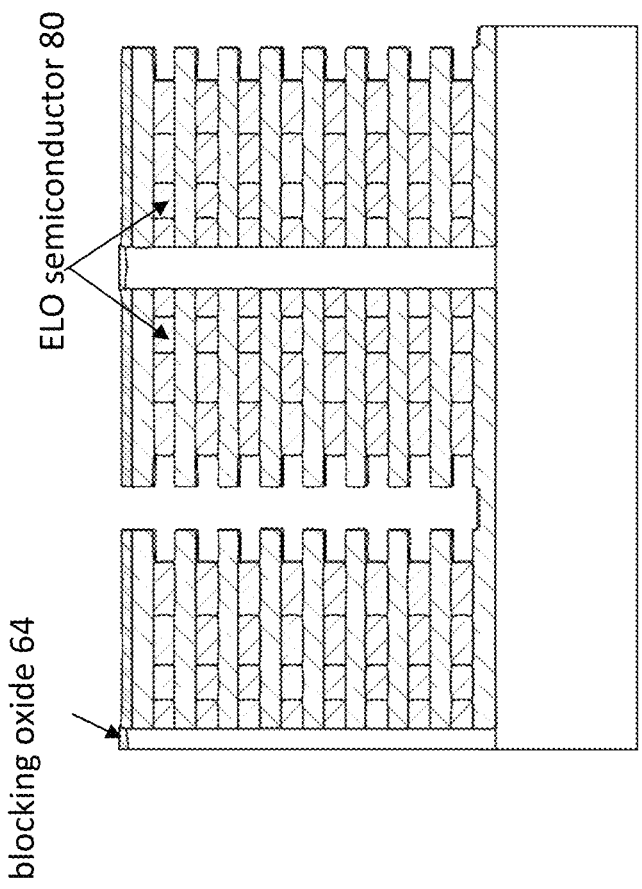
FIGS. 8A and 8B are a perspective and cross-sectional views after growth of single crystal semiconductor material.
Figure 8C:
FIG. 8C illustrates PNP and PiN devices.
Figure 8A:
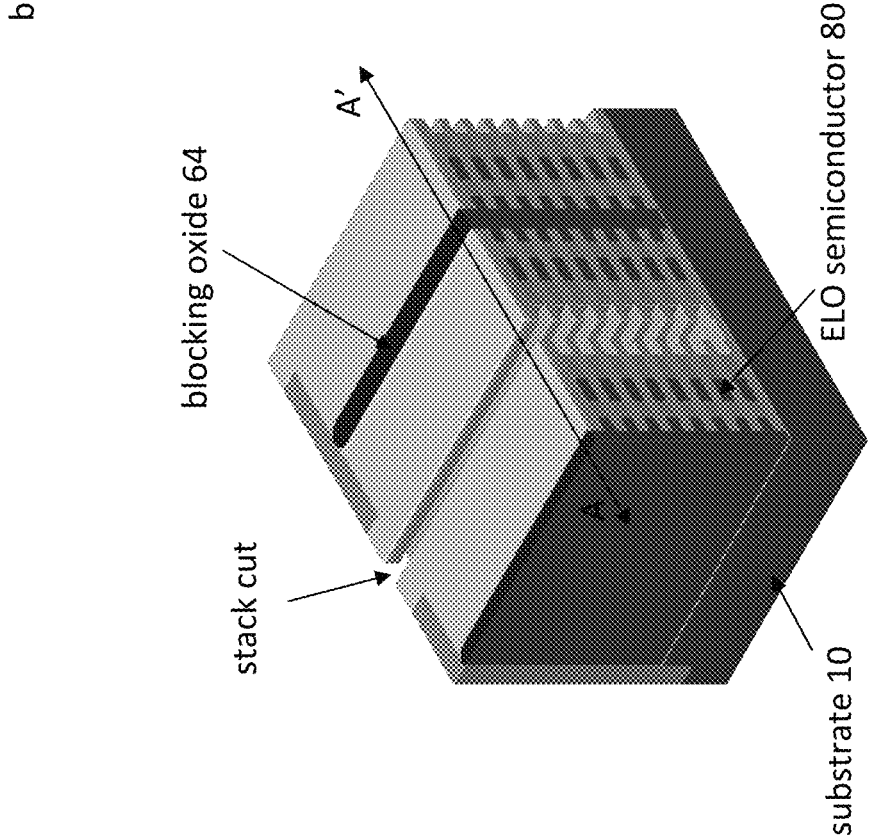

FIGS. 8A and 8B illustrate the next steps in the process. Using the exposed SEG semiconductor 30 side surface as a seed, single crystal semiconductor 80 is grown between the layers of silicon dioxide. This process is preferably performed using known confined epitaxial lateral overgrowth (ELO). The growth of single crystal silicon by ELO occurs only at crystalline semiconductor surfaces. As the process proceeds, desired semiconductor dopants are introduced into the gas flow to create doped semiconductor regions. The choice of dopants depends upon the semiconductor devices to be formed. For illustration in FIGS. 8A and 8B alternating dopant gases of diborane ($B_2H_6$) and phosphine ($PH_3$) are used to form a pnpn semiconductor thyristor. Of course other devices such as pn or np diodes, p-i-n or n-i-p diodes, p-n-p or n-p-n diodes, programmable links, fuses, etc. could be formed in place of the illustrated thyristors. Examples of such are shown in FIG. 8C.

After forming the desired semiconductor devices, electrical connections 94, to the last formed portion of the devices, can be made using known metal silicide processes followed by a conformal deposition of low resistivity metal. After deposition the metal is isotropically etched to fill the cavity openings between the layers as shown.

Figure 9:
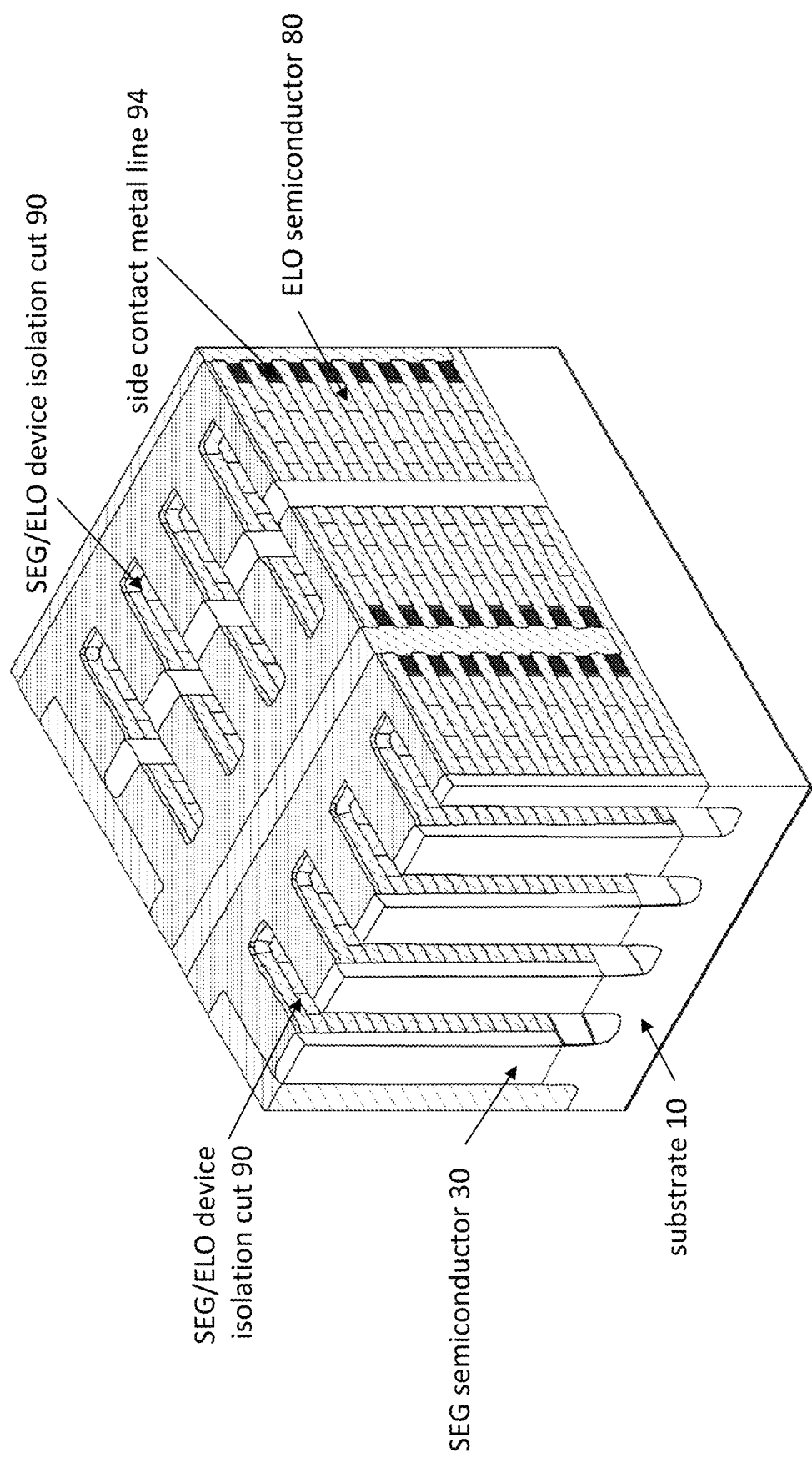
FIG. 9 is a perspective view after final cut etching.

Next using another mask, the semiconductor sheet devices 16 are then separated by a reactive ion etching process into separate stacks as shown in FIG. 9. Optionally the etching process can be continued to etch into the semiconductor substrate 10 to improve electrical isolation between the semiconductor regions 30. Following the etch, an insulating material 51 is deposited to fill the cuts 90 to form insulating columns 14, as shown in FIG. 1, and a CMP process planarizes the structure to prepare it for known processes to provide electrical connections.

Figure 10:
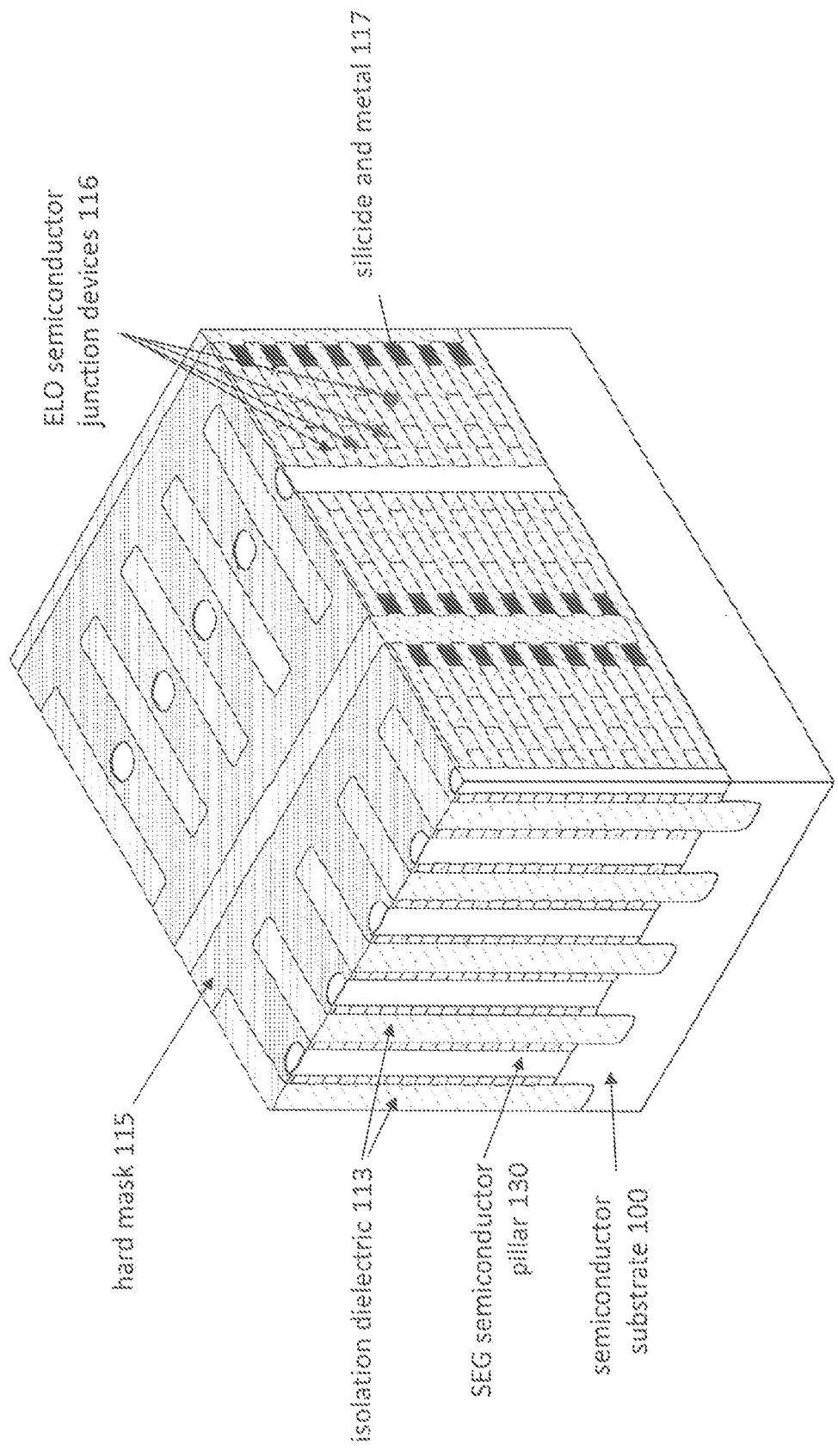
FIG. 10 is a perspective view of a second embodiment of a three-dimensional semiconductor structure.

FIG. 10 illustrates a second embodiment for a 3-dimensional array of junction devices. This structure is also formed using epitaxial lateral overgrowth (ELO), however, in this implementation seeded from vertical single crystal semiconductor pillars 130, instead of walls as in FIGS. 1-9. Compared to the embodiment above, the process flow for the structure shown in FIG. 10 reduces the number of masking, etch and CMP operations, however, the requirements for the SEG and ELO steps are more stringent because of the need for cleaning and epitaxial growth into much smaller areas. FIG. 10 also shows substrate 100, ELO semiconductor devices 116, silicide and metal contacts 117, hard mask 115, and dielectric 113.

Figures 11A, 11B:
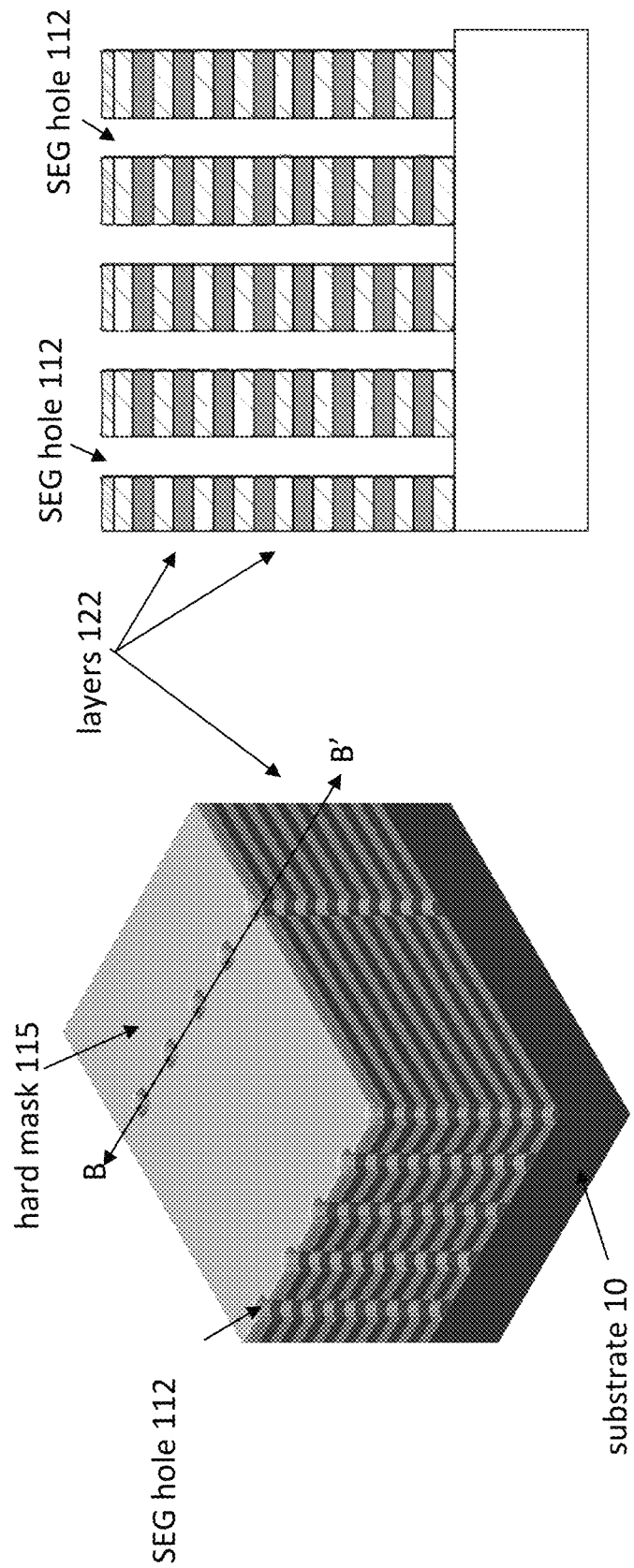
FIGS. 11A and 11B are a perspective and cross-sectional views after etching holes through a layered insulator stack.

FIG. 11A is a perspective view, and FIG. 11B is a cross-sectional view along line B-B', after forming a stack of alternating layers 122 of two materials having different etching characteristics, e.g., silicon dioxide and silicon nitride. The number of layers deposited determines the number of layers of memory devices to be formed, with in this embodiment one layer of silicon nitride deposited for each layer of memory cells. On the top of the structure a hard mask 115, typically a metal oxide such as $Al_2O_3$, is formed. After patterning the mask, appropriate etchants are used to cut holes 112 for later formation of single crystal silicon, for example, using an SEG process. The holes 112 extend through all the layers, stopping at the single crystal semiconductor substrate 100.

Figures 12A, 12B:
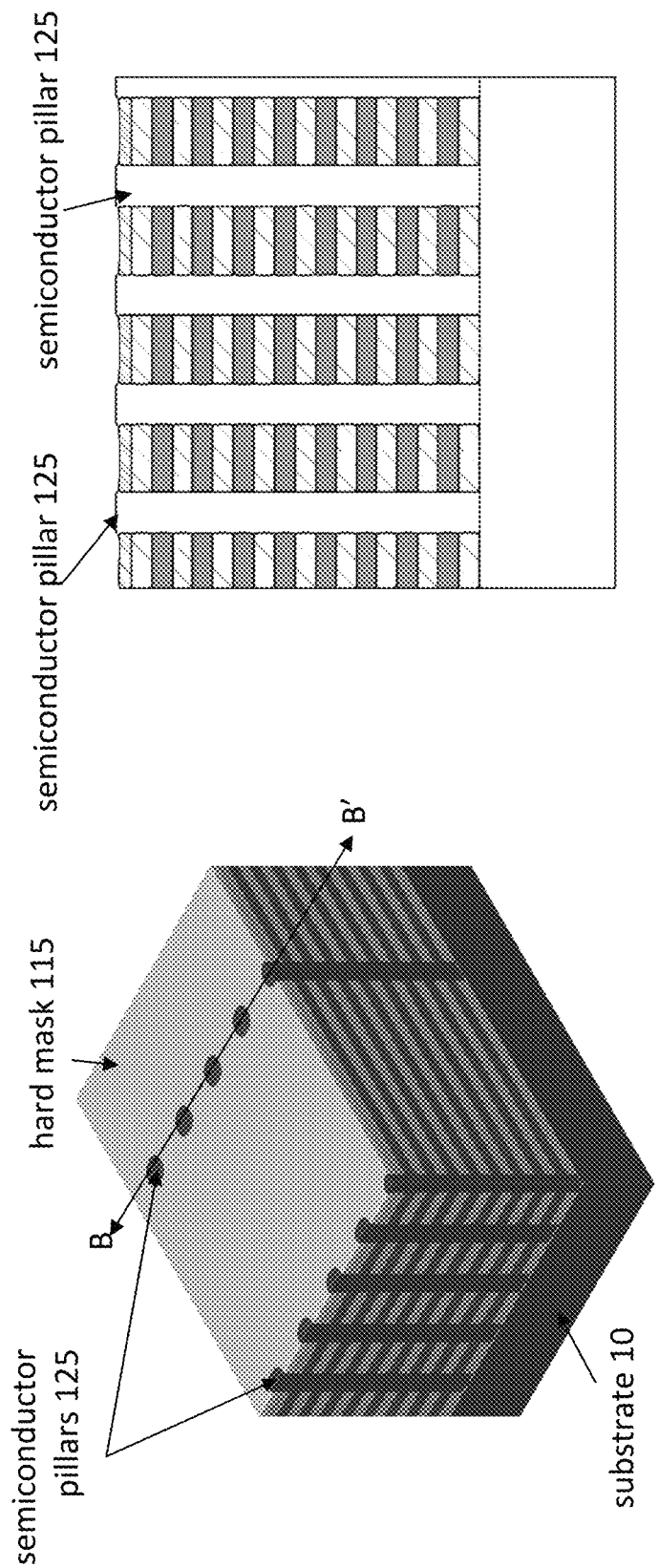
FIGS. 12A and 12B are a perspective and cross-sectional views after forming single crystal semiconductor pillars in the structure of the preceding figure.

As next shown by FIGS. 12A and 12B, after a post-etch cleaning, single crystal semiconductor pillars are grown inside the holes 112 using selective epitaxial growth. The SEG process "grows" single-crystal silicon only from the bottom of the holes where the single crystal semiconductor substrate 100 is exposed.

Figures 13, 14:
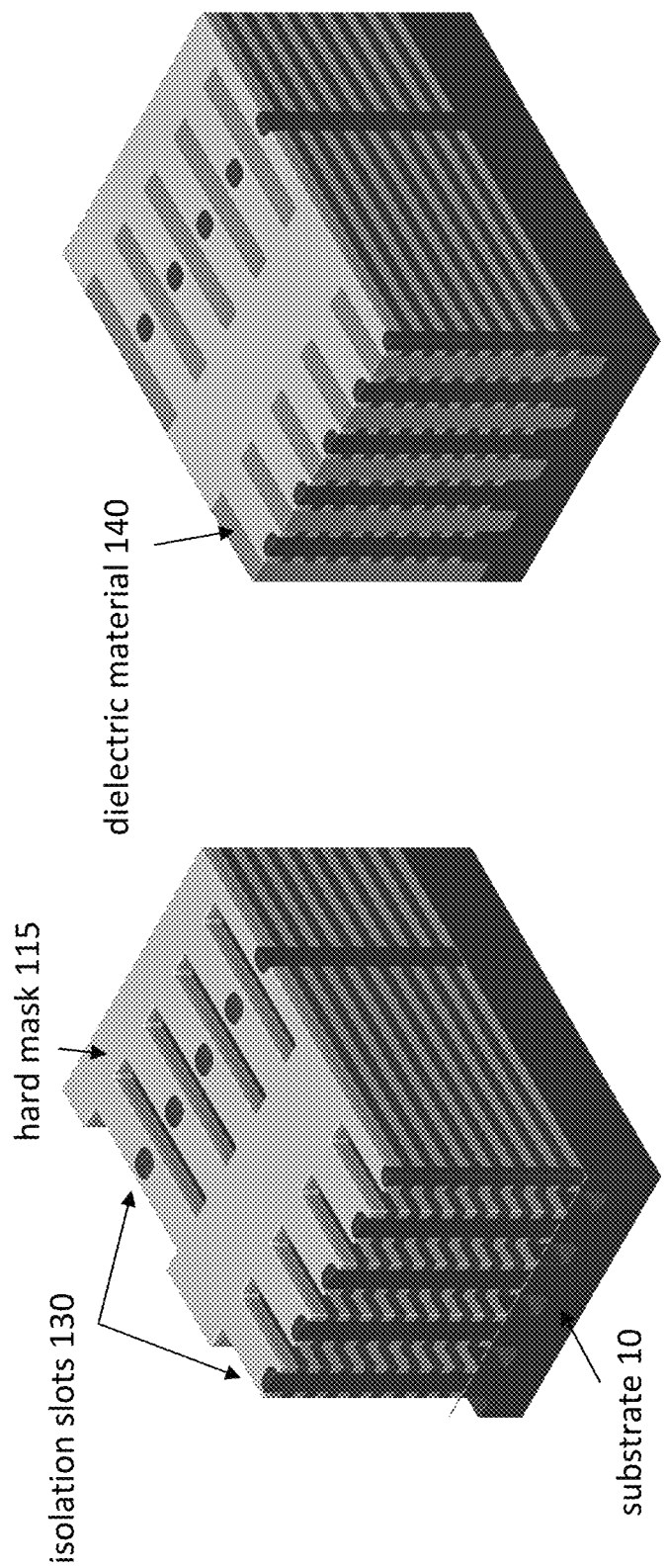
FIG. 13 is a perspective view after etching ELO isolation slots in the structure of the preceding figure.
FIG. 14 is a perspective view after filling the isolation slots with dielectric material.

The next steps in the process are illustrated by FIGS. 13 and 14. Using another lithography masking step and known dry etching technology, isolation slots 130 are etched through all of the layers down to and optionally into the substrate 10. Then, as shown in FIG. 14, the slots 130 are filled with dielectric material 140 and the structure planarized, preferably using a chemical mechanical polishing process.

Figure 15B:
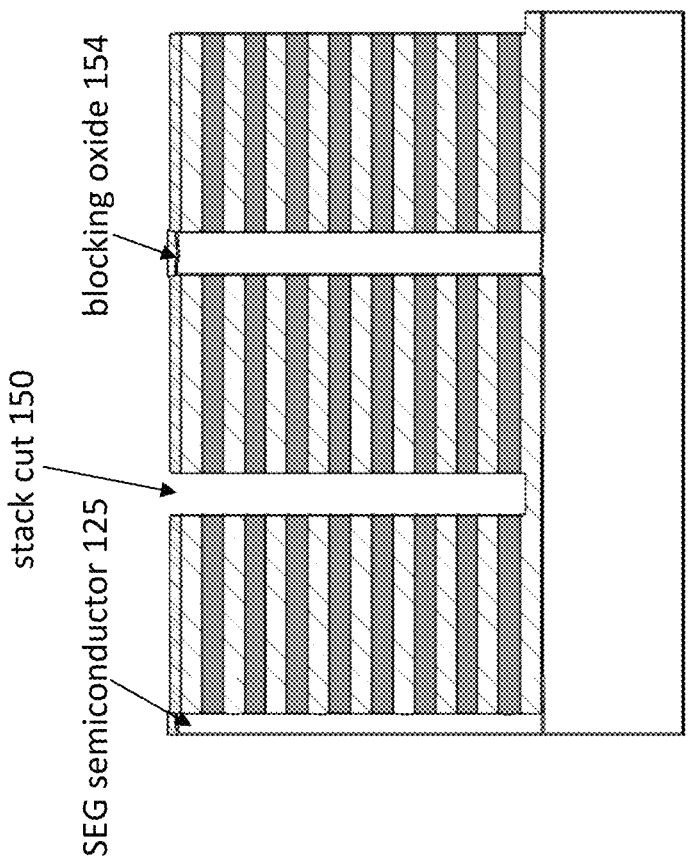
FIGS. 15A and 15B are a perspective and cross-sectional views after stack cuts are made in the structure.
Figure 15A:
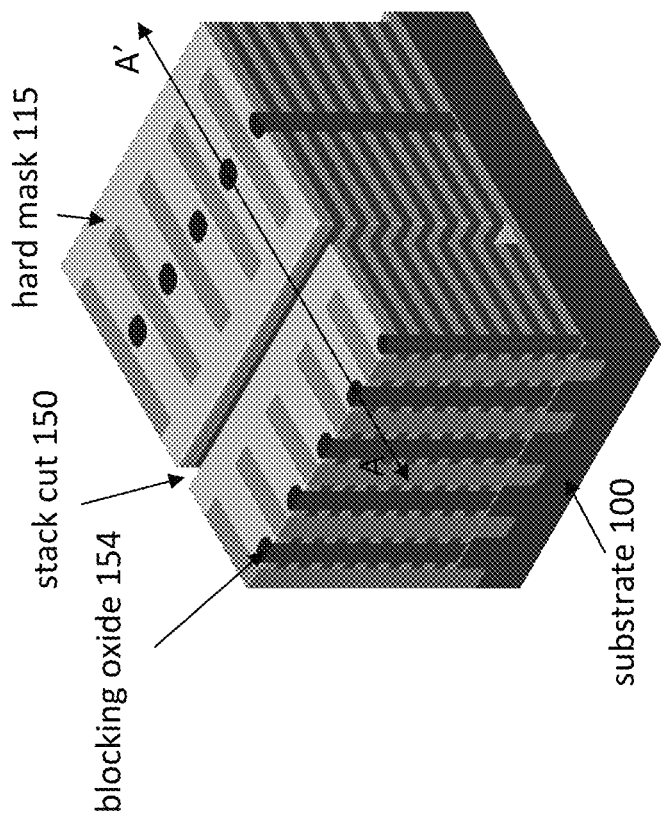

The next step in the process is etching stack cuts 150 through all of the layers down to the bottom dielectric, e.g. silicon dioxide. This is illustrated in FIGS. 15A and 15B. The cuts 150 divide the structure into parallel stacks of layers in which electrically separate semiconductor devices will be formed as described below. The stack cuts are made in the areas between the isolation slots 130. The cuts are shown in cross-section A-A' in FIG. 15B. After making the cuts 150, the exposed semiconductor surfaces are oxidized to prevent further epitaxial silicon growth in those regions. This oxide is labeled blocking oxide 154 in FIGS. 15A and 15B.

Figure 16B:
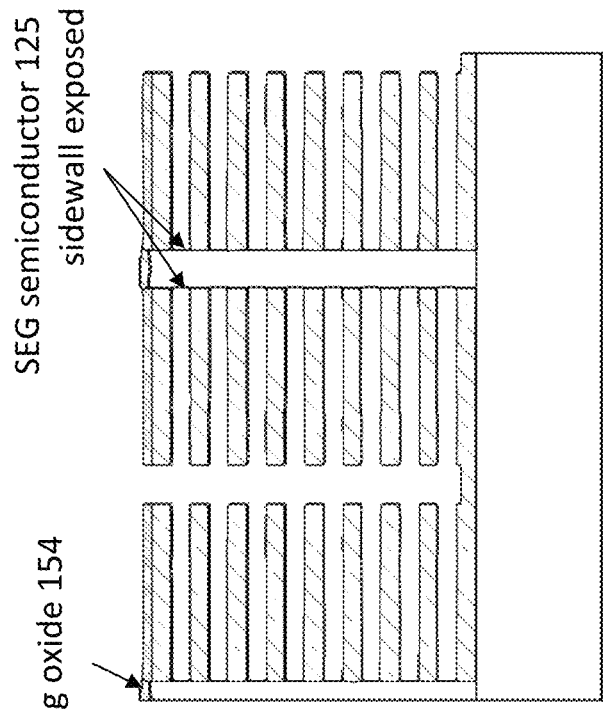
FIGS. 16A and 16B are a perspective and cross-sectional views after etching to expose the pillars.
Figure 16A:
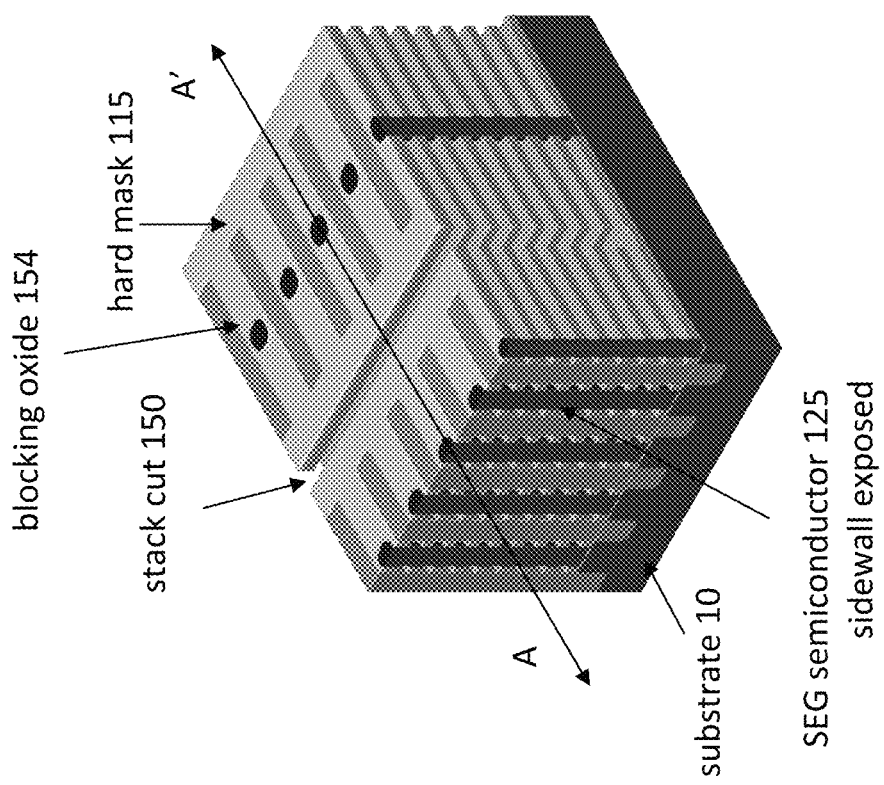

Using an appropriate isotropic etchant the structure is next etched to remove alternating layers of the stacks where the edges of those layers are exposed by the stack cuts. The resulting structure after etching is shown in FIG. 16A and in cross-section A-A' in FIG. 16B. In the preferred embodiment the silicon nitride layers are removed, leaving only the silicon dioxide layers. The silicon dioxide layers are supported by the surrounding material. This etch also exposes the sidewalls of the SEG pillars 125.

Figure 17B:
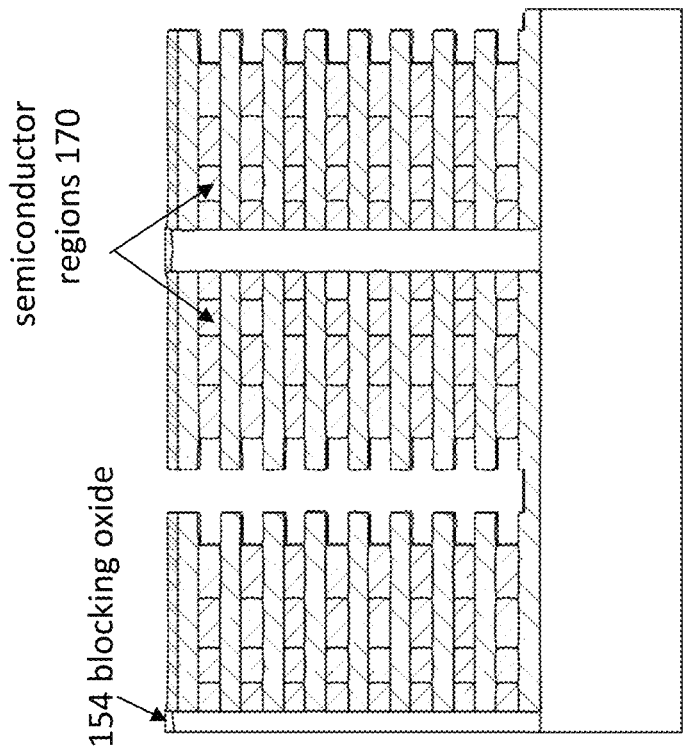
FIGS. 17A and 17B are a perspective and cross-sectional views after formation of single crystal semiconductor using the exposed pillars.
Figure 17A:
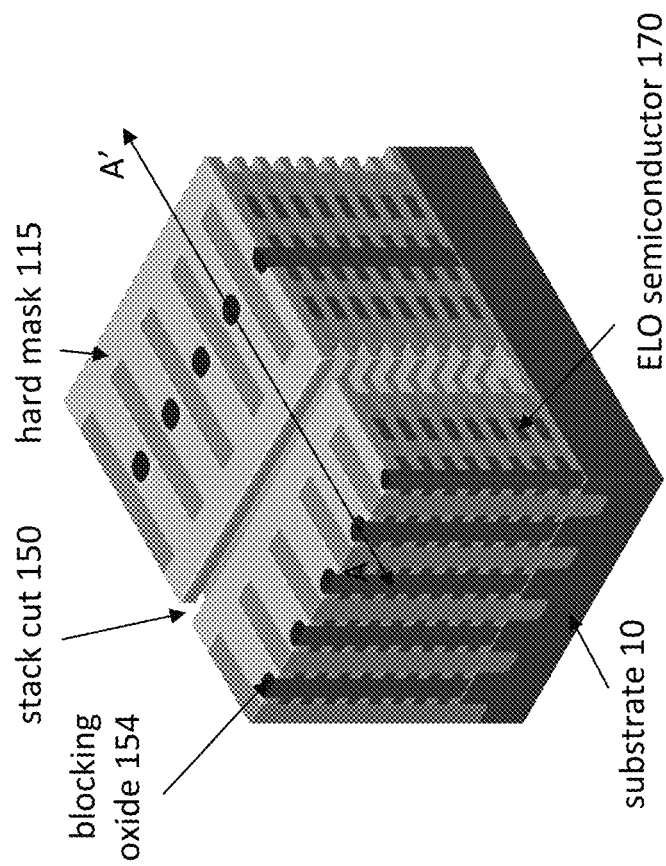

FIGS. 17A and 17B illustrate the next steps in the process. Using the exposed SEG semiconductor 125 sidewall surfaces as seed, single crystal semiconductor 170 is grown between the layers of silicon dioxide. This process preferably is performed using confined epitaxial lateral overgrowth, as mentioned above. The growth of single crystal silicon by ELO occurs only at single crystal semiconductor surfaces. As the process proceeds, desired semiconductor dopant is introduced into the gas flow to create doped semiconductor regions. The choice of dopants depends upon the semiconductor devices to be formed. For illustration in FIGS. 17A and 17B alternating dopant gases of diborane ($B_2H_6$) and phosphine ($PH_3$) are used to form a pnpn semiconductor thyristor. Of course other devices such as pn or np diodes, p-i-n or n-i-p diodes, p-n-p or n-p-n diodes, programmable links, fuses, etc. could be formed by use of appropriate processing in place of the illustrated thyristors.

Figure 18:
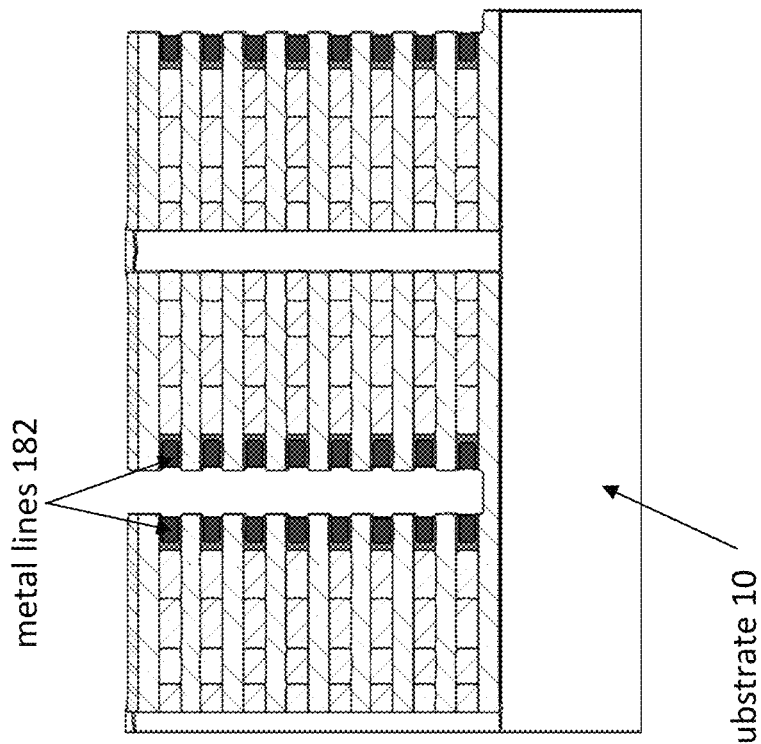
FIG. 18 is a cross-sectional view after formation of electrical connections.

After forming the desired semiconductor devices, electrical connections 180 to the last formed, and therefore exposed edge, using a known metal silicide process followed by a conformal deposition of low resistivity metal 182. After deposition the metal 182 is isotropically etched to fill the cavity openings between the layers, as shown in FIG. 18.

Figure 19:
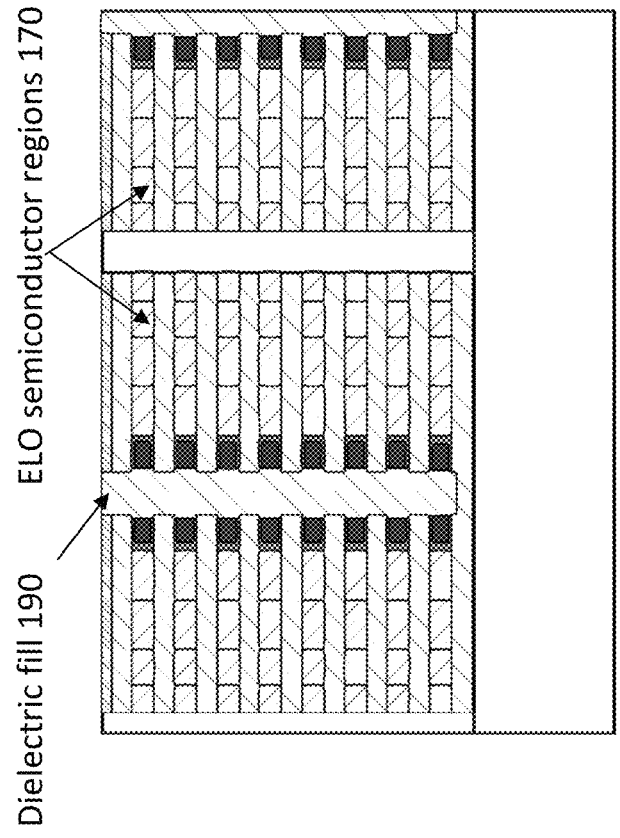
FIG. 19 is a cross-sectional view after filling of the stack cuts with dielectric material.

Following the etch, an insulating material 190 is deposited, filling the cuts, and a CMP process planarizes the structure and prepare it for well-known processes to form additional electrical connections as shown in FIG. 19.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A multi-layer semiconductor memory cell array, comprising:
   a semiconductor substrate;
   a first m by n array of semiconductor memory cells extending in a first x direction-y direction plane and electrically connected in a x direction to first terminal lines;
   at least one second m by n array of the semiconductor memory cells extending in the a second x direction-y direction plane and electrically connected in the x direction to the first terminal lines, the at least one second m by n array of the semiconductor memory cells being stacked vertically above the first m by n array of the semiconductor memory cells; and
   each of the semiconductor memory cells comprising only a single crystal silicon, and wherein m and n are integers.

2. The multi-layer semiconductor memory cell array as in claim 1, wherein the at least one second m by n array of the semiconductor memory cells comprises a plurality of second m by n arrays of the semiconductor memory cells, each array of the semiconductor memory cells is separated from one another by a first insulating material.

3. The multi-layer semiconductor memory cell array as in claim 2, wherein columns of a second insulating material extend vertically through the first m by n array of the semiconductor memory cells and the plurality of second m by n arrays of the semiconductor memory cells to separate the semiconductor memory cells from otherwise adjoining semiconductor memory cells.

4. The multi-layer semiconductor memory cell array as in claim 3, wherein the semiconductor memory cells and other adjoining semiconductor memory cells each comprise at least one of the following: pn diodes, p-i-n diodes, pnp diodes, npn diodes, pnpn thyristors, and npnp thyristors.

5. The multi-layer semiconductor memory cell array as in claim 1, made by a process comprising:
   depositing a plurality of layers of material on the semiconductor substrate, at least two separated layers of the plurality of layers having material etching characteristics different than other layers in the plurality of layers;
   removing a first region of each of the plurality of layers down to the semiconductor substrate;
   forming a single crystal semiconductor material comprised only a first single crystal silicon in the first region;
   removing the at least two separated layers and exposing the first single crystal silicon;
   forming a second single crystal silicon in place of the at least two separated layers; and
   during the step of forming the second single crystal silicon in place of the at least separated two layers, introducing at least one semiconductor dopant to dope the second single crystal silicon to have a desired conductivity type.

6. The multi-layer semiconductor memory cell array as in claim 1, made by a process comprising:
   depositing alternating layers of a first material and a second material on the semiconductor substrate, the semiconductor substrate comprising a single crystal silicon, the first material and the second material having different etching characteristics;
   removing a first slot region of each of the alternating layers down to the semiconductor substrate;
   using the semiconductor substrate as a seed, forming a single crystal semiconductor material comprised only a first single crystal silicon in the first slot region;
   removing a support slot region of each of the alternating layers down to the semiconductor substrate, the support slot region being in contact with and orthogonal to a first end of the first slot region;
   filling the support slot region with a dielectric material;
   removing a stack cut region of each of the alternating layers down to the semiconductor substrate, the stack cut region being parallel to and spaced apart from the first slot region;
   removing the layers of the second material;
   forming a second single crystal silicon in place of the layers of second material; and
   during the step of forming the second single crystal semiconductor material silicon in place of the layers of the second material, introducing at least one semiconductor dopant to dope the second single crystal silicon to have a desired conductivity type.

* * * * *